United States Patent
Shin et al.

(10) Patent No.: US 11,351,870 B2
(45) Date of Patent: Jun. 7, 2022

(54) FAULT DIAGNOSING METHOD AND APPARATUS OF POWER ELECTRIC SYSTEM FOR VEHICLE

(71) Applicants: Hyundai Motor Company, Seoul (KR); Kia Motors Corporation, Seoul (KR)

(72) Inventors: Ho Joon Shin, Suwon-si (KR); Nam Koo Han, Yongin-si (KR); Sang Yoo Lee, Seoul (KR); Heon Young Kwak, Hwaseong-si (KR); Hong Geuk Park, Cheonan-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 475 days.

(21) Appl. No.: 16/656,345

(22) Filed: Oct. 17, 2019

(65) Prior Publication Data
US 2020/0180438 A1    Jun. 11, 2020

(30) Foreign Application Priority Data
Dec. 11, 2018  (KR) .................. 10-2018-0159462

(51) Int. Cl.
| B60L 3/12 | (2006.01) |
| H02P 27/06 | (2006.01) |
| G07C 5/08 | (2006.01) |
| G01R 31/00 | (2006.01) |
| H02M 7/5387 | (2007.01) |

(52) U.S. Cl.
CPC ............. *B60L 3/12* (2013.01); *G01R 31/007* (2013.01); *G07C 5/0808* (2013.01); *H02P 27/06* (2013.01); *H02M 7/5387* (2013.01)

(58) Field of Classification Search
CPC ........ B60L 3/12; G01R 31/007; G07C 5/0808
See application file for complete search history.

(56) References Cited

U.S. PATENT DOCUMENTS

| 2009/0306841 A1* | 12/2009 | Miwa ................. B60L 53/24 701/31.4 |
| 2011/0241578 A1* | 10/2011 | Kim .................. B60L 50/13 318/400.02 |
| 2014/0139150 A1* | 5/2014 | Morisaki ............. B60L 50/61 318/139 |
| 2016/0248317 A1* | 8/2016 | Taguchi ............. H02M 7/5387 |
| 2018/0175776 A1* | 6/2018 | Tsujii ................ B60L 15/007 |

FOREIGN PATENT DOCUMENTS

KR  10-2015-0118307 A   10/2015

* cited by examiner

*Primary Examiner* — Alvaro E Fortich
(74) *Attorney, Agent, or Firm* — Morgan, Lewis & Bockius LLP (57) ABSTRACT

A fault diagnosis method of a power electric system for a vehicle may include driving an inverter to output an output voltage command for fault detection; measuring a current input to each phase of a motor connected to the inverter; measuring a voltage of the neutral stage of the motor; and determining whether there are faults of a connection member connecting between the inverter and the motor and a relay connected to the neutral stage of the motor based on the measured current input to each phase of the motor and the voltage of the neutral stage.

15 Claims, 9 Drawing Sheets

FAULT DIAGNOSING METHOD AND APPARATUS OF POWER ELECTRIC SYSTEM FOR VEHICLE

CROSS REFERENCE TO RELATED APPLICATION

The present application claims priority to Korean Patent Application No. 10-2018-0159462 filed on Dec. 11, 2018, the entire contents of which is incorporated herein for all purposes by this reference.

BACKGROUND OF THE INVENTION

Field of the Invention

The present invention relates to a fault diagnosing method and apparatus of a power electric system for a vehicle, and more specifically, to a fault diagnosing method and apparatus of a power electric system for a vehicle configured for diagnosing faults of a wire member connecting between an inverter and a motor and a relay connected to a neutral stage of a motor in a power electric system for a vehicle.

Description of Related Art

Environmentally friendly vehicles such as an electric vehicle (EV), a plug-in hybrid electric vehicle (PHEV), or a fuel cell are equipped with a drive motor for traveling a vehicle.

Figure 1:
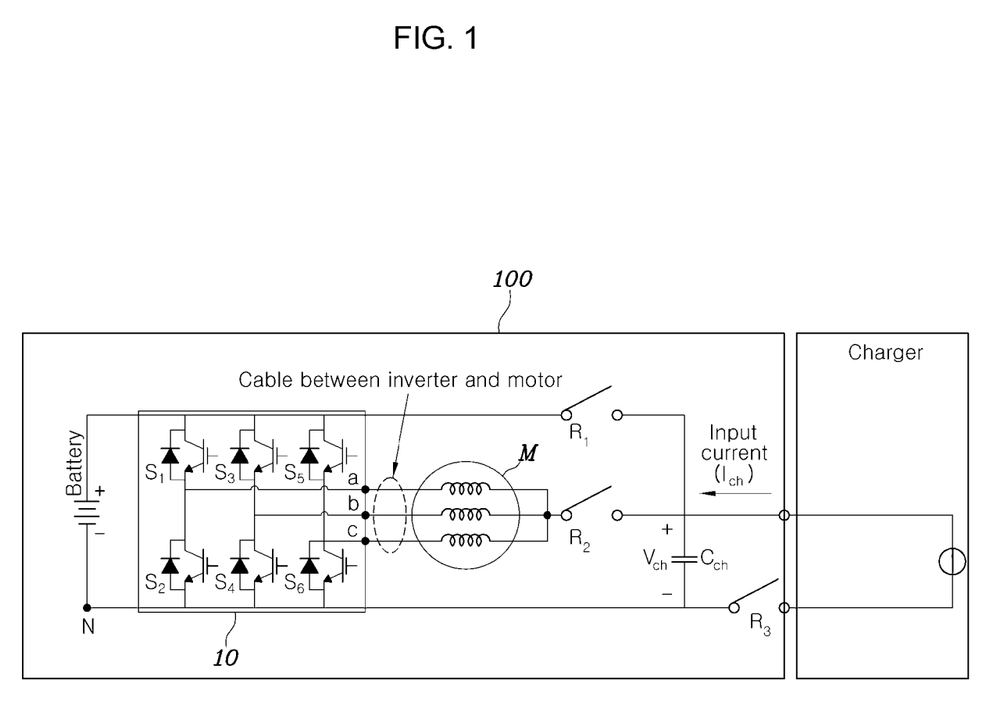
FIG. 1 is a diagram illustrating a conventional power electric system for a vehicle using a motor-inverter.

Meanwhile, FIG. 1 illustrates a conventional power electric system for a vehicle using a motor-inverter. As illustrated in FIG. 1, each phase a, b, and c of the drive motor M is connected to an output terminal of the inverter 10, and a relay R2 is connected to a neutral stage s of the drive motor. In connection with the safety of the vehicle, it is very important to diagnose faults of a wire member connecting between each phase of the drive motor and the output terminal of the inverter and the relay connected to the neutral stage of the drive motor. Conventionally, in a process of diagnosing the fault of the wire member connecting between each phase of the drive motor and the output terminal of the inverter, it is generally determined to be fault when a feedback sensing value (current sensing value of each phase by a current sensor) to a current command is out of a normal range while a vehicle is traveling.

However, this method has a restriction that the speed of the drive motor is required because it may be determined as a fault depending on the position of the rotor of the drive motor even under normal circumferences. A pure electric vehicle having only the drive motor has a problem that the fault of the wire member is impossible when there is no vehicle speed.

The information included in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a fault diagnosing method and apparatus of a power electric system for a vehicle configured for diagnosing faults of a wire member connecting between an inverter and a motor and a relay connected to a neutral stage of a motor in a state in which a vehicle is not traveling.

According to an exemplary embodiment of the present invention, there is provided a fault diagnosis method of a power electric system for a vehicle including: driving an inverter to output an output voltage command for fault detection; measuring a current input to each phase of a motor connected to the inverter; measuring a voltage of the neutral stage of the motor; and determining whether there are faults of a wire member connecting between the inverter and the motor and a relay connected to the neutral stage of the motor based on the measured current input to each phase of the motor and the voltage of the neutral stage.

The fault diagnosis method may further include: prior to driving the inverter to output the output voltage command for fault detection, generating the output voltage command for the fault detection.

The generating of the output voltage command for fault detection may include: receiving a current command for fault diagnosis of the wire member connected to the inverter and the motor which is preset by a current controller and a current measurement value input to each phase of the motor and generating a voltage command of each phase of the motor; receiving the voltage command for the fault diagnosis of the relay connected to the neutral stage of the motor which is preset by the voltage controller and a voltage measurement value of the neutral stage of the motor and generating a neutral stage voltage command of the motor; and generating a final output voltage command of the inverter by adding the voltage command of each phase generated by the current controller to a voltage command value of the neutral stage of the motor generated by the voltage controller.

In the determining whether there are the faults of the wire member connecting between the inverter and the motor and the relay connected to the neutral stage of the motor, if the measured current input to each phase of the motor has a form of a sinusoidal wave, it may be determined that the wire member is normal.

In the determining whether there are the faults of the wire member connecting between the inverter and the motor and the relay connected to the neutral stage of the motor, if the measured current is zero rather than the sinusoidal wave, it may be determined that the wire member connected to a phase on which the zero is measured fails.

In the determining whether there are the faults of the wire member connecting between the inverter and the motor and the relay connected to the neutral stage of the motor, if the voltage of the neutral stage of the motor measured while the relay is open is not changed before and after the voltage command for the fault diagnosis of the relay is generated, it may be determined that the corresponding relay is normal.

In the determining whether there are the faults of the wire member connecting between the inverter and the motor and the relay connected to the neutral stage of the motor, if the voltage of the neutral stage of the motor measured while the relay is open is within the preset error range of the voltage command of the neutral stage of the motor, it may be determined that the corresponding relay is fused.

According to various exemplary embodiments of the present invention, there is provided a fault diagnosis apparatus of a power electric system for a vehicle including: a power transmission unit configured to include a battery, a motor, an inverter connected in parallel to the battery and connected to the motor, and a relay connected to a neutral stage of the motor; a current sensor configured to measure a current input to each phase of the motor; a voltage sensor configured to measure a voltage of the neutral stage of the motor; and a controller configured to drive the inverter according to a separate voltage command for fault detection and detect faults of a wire member connecting between the inverter and the motor and the relay based on a current value measured by the current sensor and a voltage value measured by the voltage sensor.

The controller may include: a current controller configured to receive a preset current command for fault diagnosis of a wire member connected to the inverter and the motor and a current measurement value input to each phase of the motor and generate a voltage command of each phase of the motor; a voltage controller configured to receive the preset voltage command for fault diagnosis of the relay connected to the neutral stage of the motor and a voltage measurement value of the neutral stage of the motor and generate the voltage command of the neutral stage of the motor; and a final output voltage command generation unit configured to generate a final output voltage command of the inverter by adding the voltage command of each phase generated by the current controller to the voltage command of the neutral stage of the motor generated by the voltage controller.

The controller may be configured to determine that the wire member is normal if a value of the measured current input to each phase of the motor is periodically changed in a form of a sinusoidal wave.

The controller may be configured to determine that the wire member connected to the phase on which the zero is measured fails if there is zero in the measured current values input to each phase of the motor.

The controller may be configured to determine that the corresponding relay is normal if the voltage of the neutral stage of the motor measured while the relay is open is zero.

The controller may be configured to determine that the corresponding relay is fused if the voltage of the neutral stage of the motor measured while the relay is open is within the preset error range of the voltage command of the neutral stage of the motor.

The voltage command of each phase of the motor generated by the current controller may be a differential mode (DM) voltage component, and the voltage command of the neutral stage of the motor generated by the voltage controller may be a common mode (CM) voltage component.

The final output voltage command of the inverter generated by the final output voltage command generation unit may include the differential mode voltage component and the common mode voltage component.

According to an exemplary embodiment of the present invention, it is possible to diagnose the faults of the wire member connecting between the inverter and the motor and the relay connected to the neutral stage of the motor in the state where the vehicle is not traveling.

Furthermore, even if the fault diagnoses of the wire member connected to each phase of the motor and the relay connected to the neutral stage of the motor are performed at the same time, it is possible to prevent the wrong diagnosis by distinguishing between the faults of the wire member and the relay without the mutual interference of these faults.

Furthermore, it is possible to shorten the driving or charging time by reducing the failure diagnosis time and improving the commerciality accordingly.

The methods and apparatuses of the present invention have other features and advantages which will be apparent from or are set forth in more detail in the accompanying drawings, which are incorporated herein, and the following Detailed Description, which together serve to explain certain principles of the present invention.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent portions of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Hereinafter, a fault diagnosis method and apparatus of a power electric system for a vehicle according to exemplary embodiments of the present invention will be described with reference to the accompanying drawings.

Figure 2:
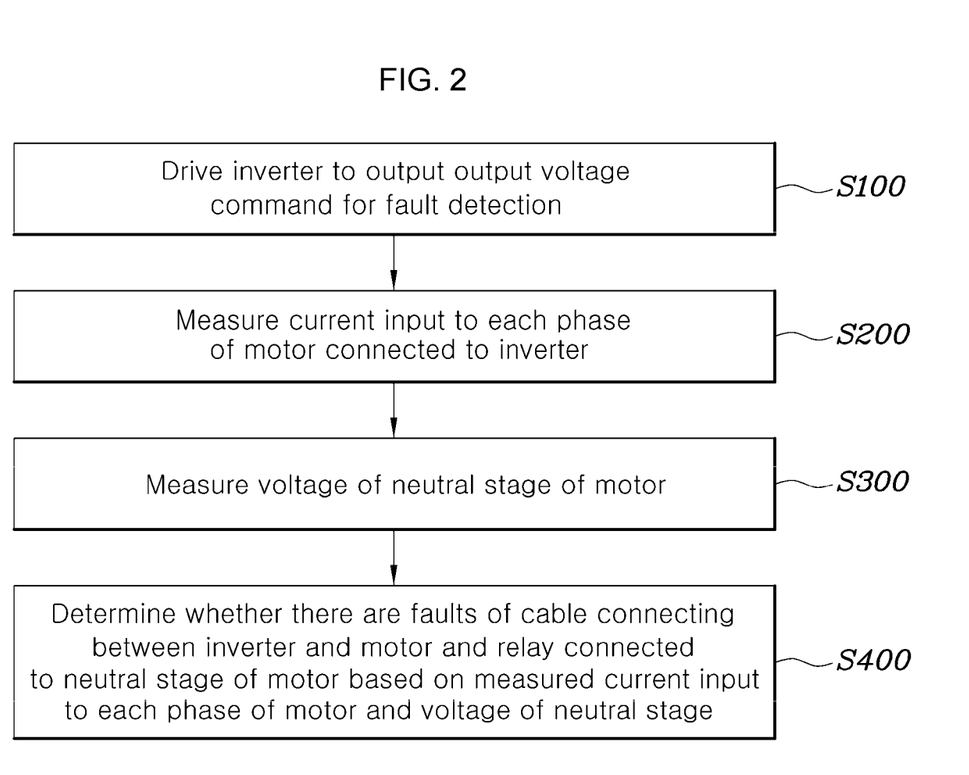
FIG. 2 is a flowchart illustrating a flow of a fault diagnosis method of a power electric system for a vehicle according to an exemplary embodiment of the present invention.
Figure 3:
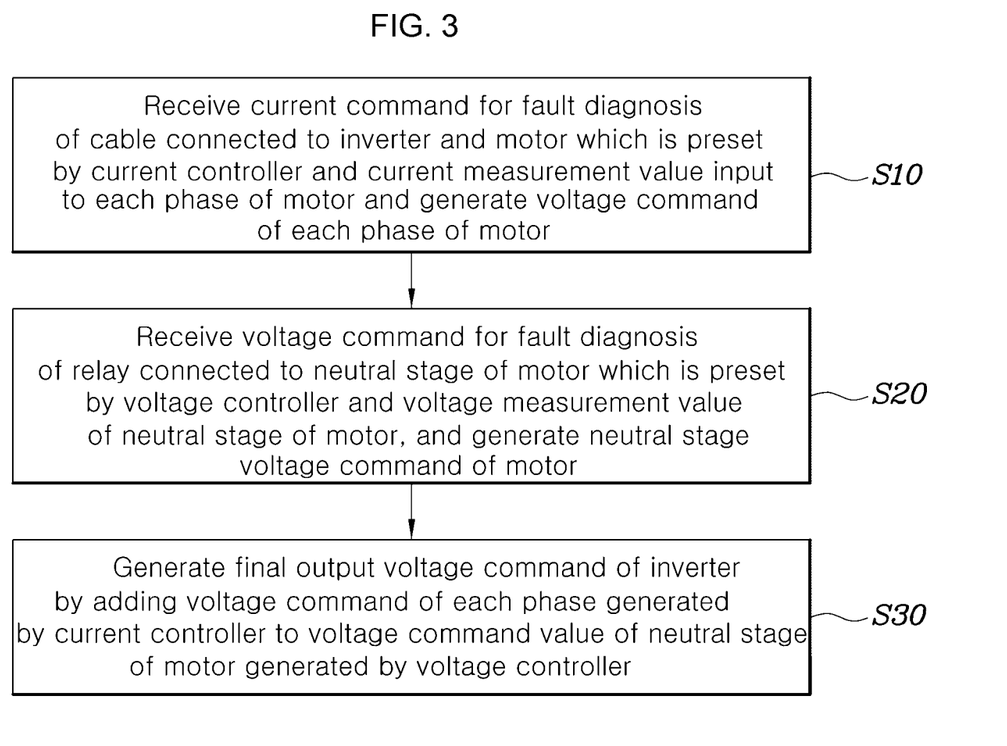
FIG. 3 is a flowchart illustrating a process of generating an output voltage command for fault detection in a fault diagnosis method of a power electric system for a vehicle according to the exemplary embodiment of the present invention.
Figure 4:
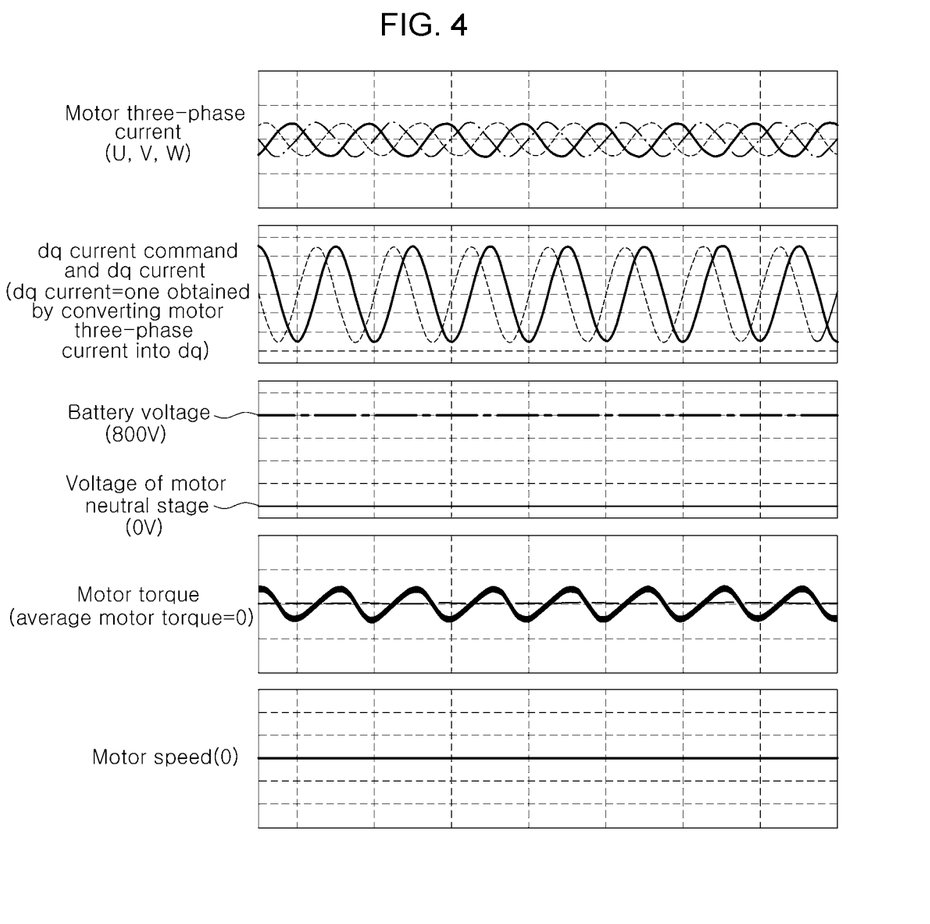
FIG. 4 is a diagram illustrating a current of each phase of a motor and a voltage of a neutral stage which are measured when the power electric system for the vehicle is in a normal state, in the fault diagnosis method of a power electric system for a vehicle according to the exemplary embodiment of the present invention.
Figure 5:
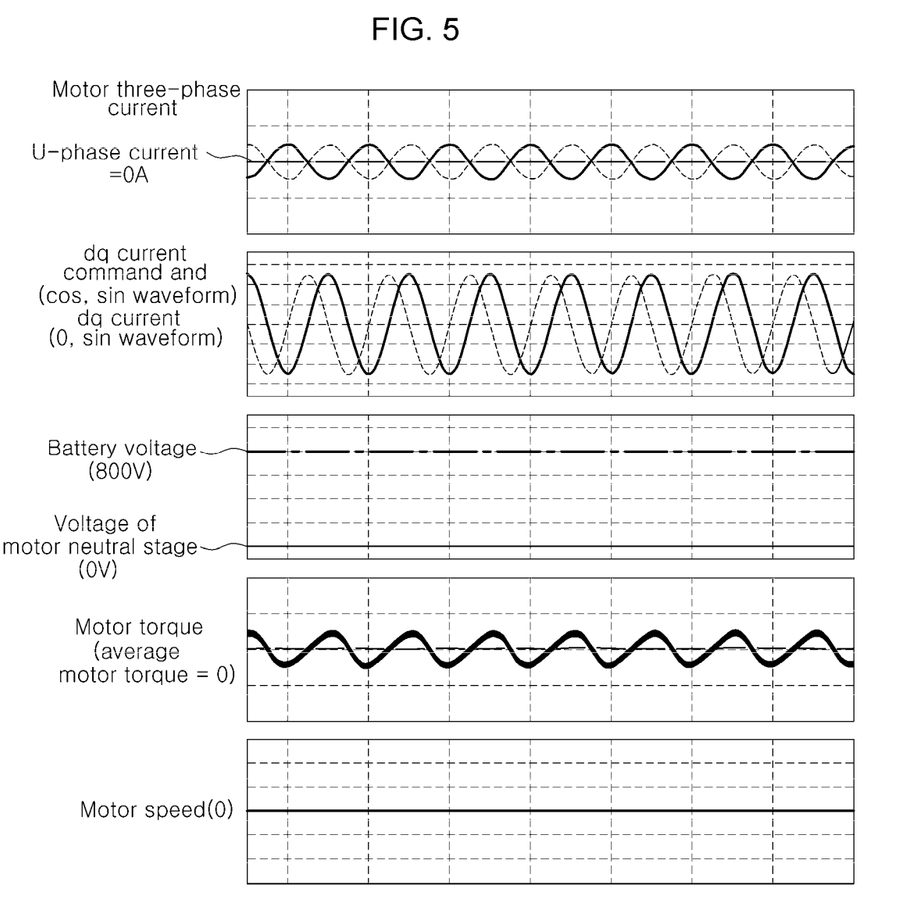
FIG. 5 is a diagram illustrating a current of each phase of a motor and a voltage of a neutral stage which are measured when the wire member connected to U phase of the motor fails, in the fault diagnosis method of a power electric system for a vehicle according to the exemplary embodiment of the present invention.
Figure 6:
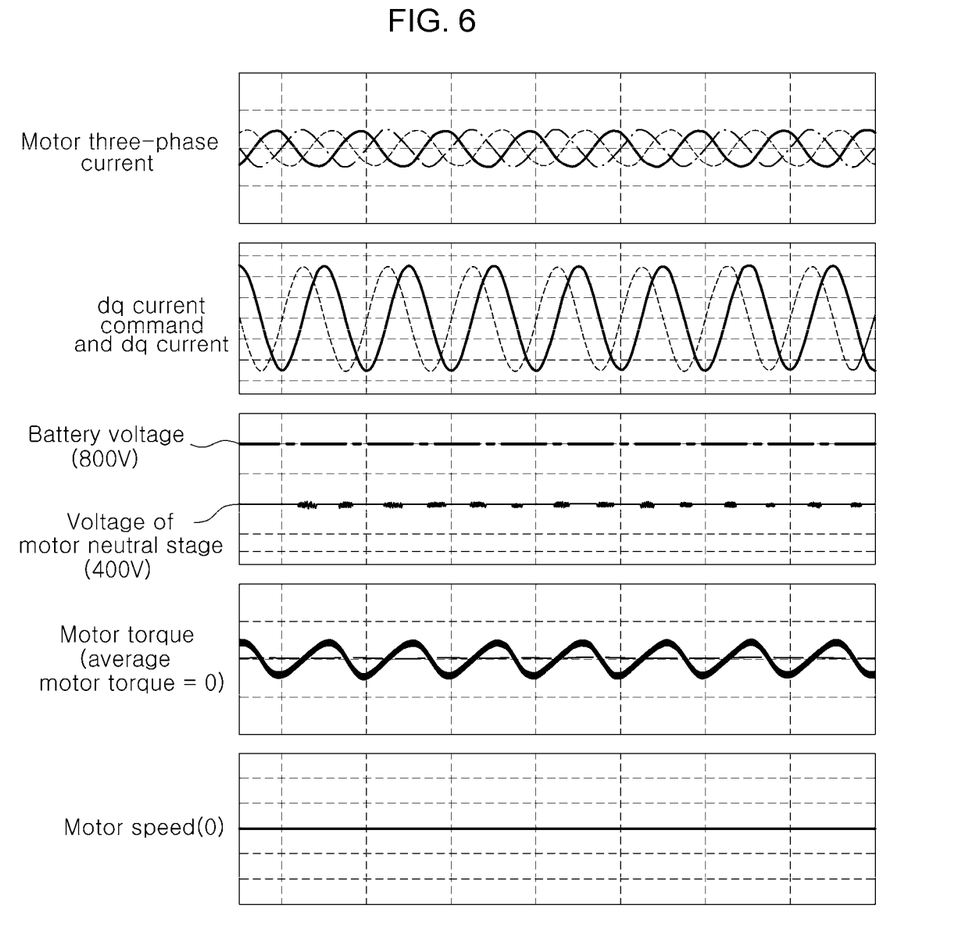
FIG. 6 is a diagram illustrating the current of each phase of the motor and the voltage of the neutral stage which are measured when the relay of the neutral stage of the motor fails, in the fault diagnosis method of a power electric system for a vehicle according to the exemplary embodiment of the present invention.
Figure 7:
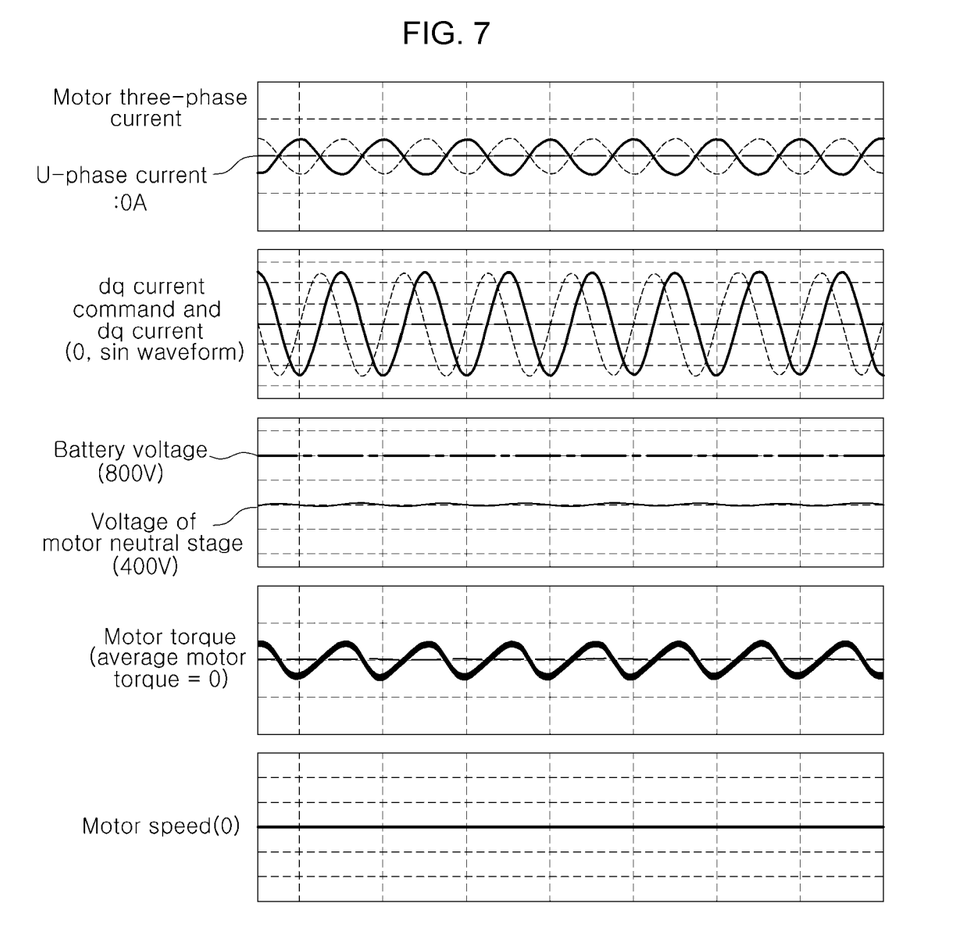
FIG. 7 is a diagram illustrating the current of each phase of the motor and the voltage of the neutral stage which are measured when the relay of the neutral stage of the motor and the wire member connected to the U phase of the motor fail, in the fault diagnosis method of a power electric system for a vehicle according to the exemplary embodiment of the present invention.
Figure 8:
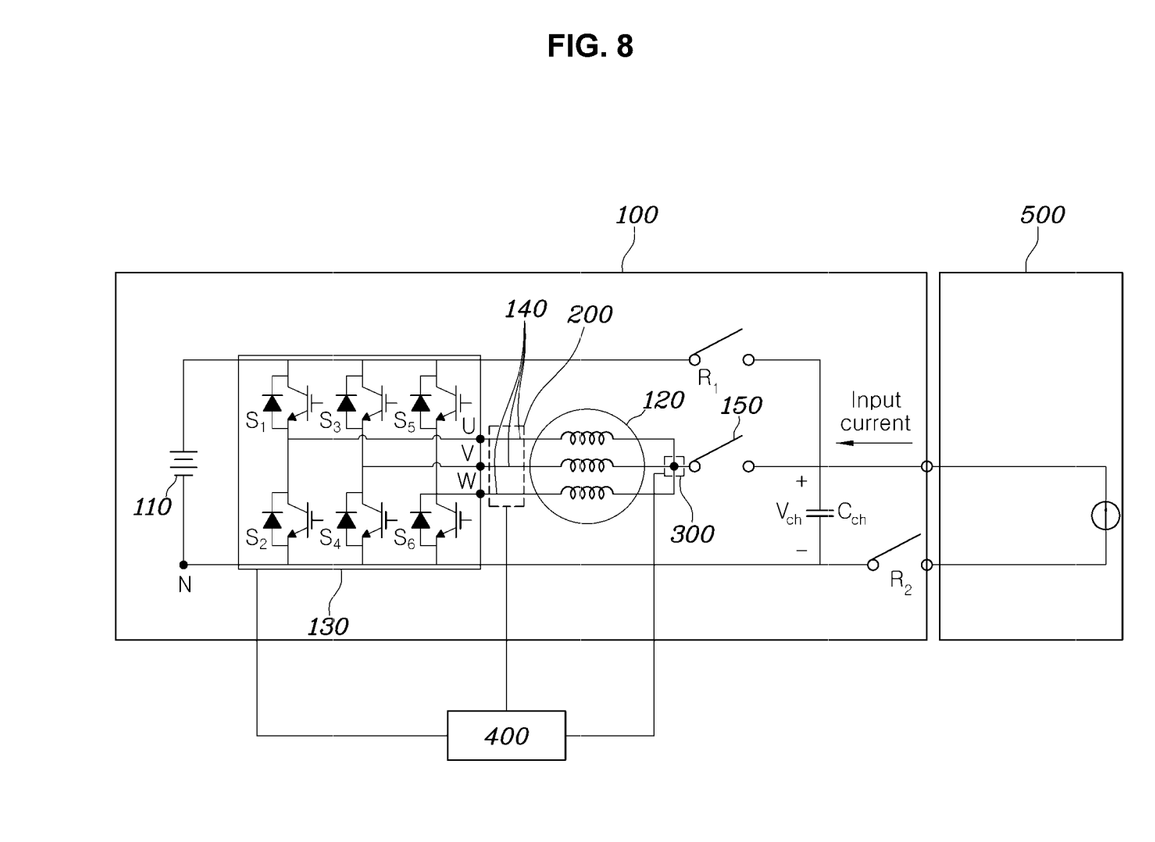
FIG. 8 is a diagram illustrating a configuration of a fault diagnosis apparatus configured for a power electric system for a vehicle according to an exemplary embodiment of the present invention.
Figure 9:
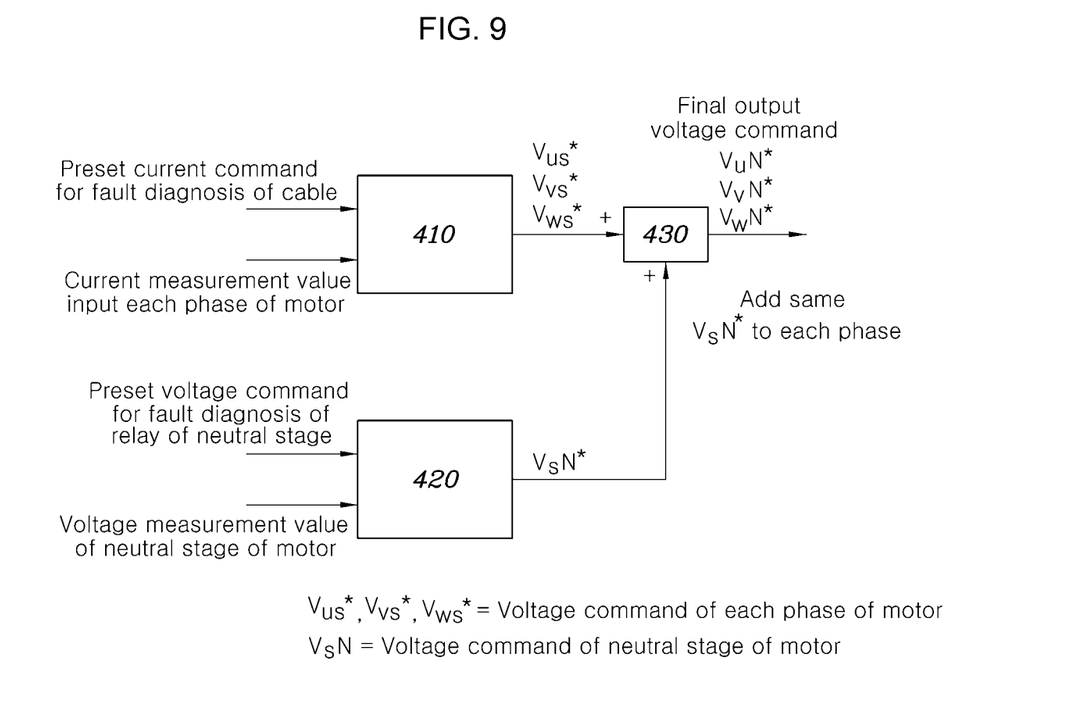
FIG. 9 is a diagram illustrating that an output voltage command of an inverter is generated in the fault diagnosis apparatus of a power electric system for a vehicle according to the exemplary embodiment of the present invention.

FIG. 2 is a flowchart illustrating a flow of a fault diagnosis method of a power electric system for a vehicle according to an exemplary embodiment of the present invention, FIG. 3 is a flowchart illustrating a process of generating an output voltage command for fault detection in a fault diagnosis method of a power electric system for a vehicle according to the exemplary embodiment of the present invention, FIG. 4 is a diagram illustrating a current of each phase of a motor and a voltage of a neutral stage which are measured when the power electric system for the vehicle is in a normal state, in the fault diagnosis method of a power electric system for a vehicle according to the exemplary embodiment of the present invention, FIG. 5 is a diagram illustrating a current of each phase of a motor and a voltage of a neutral stage which are measured when the wire member 140 connected to U phase of the motor fails, in the fault diagnosis method of a power electric system for a vehicle according to the exemplary embodiment of the present invention, FIG. 6 is a diagram illustrating the current of each phase of the motor and the voltage of the neutral stage which are measured when the relay of the neutral stage of the motor fails, in the fault diagnosis method of a power electric system for a vehicle according to the exemplary embodiment of the present invention, FIG. 7 is a diagram illustrating the current of each phase of the motor and the voltage of the neutral stage which are measured when the relay of the neutral stage of the motor and the wire member 140 connected to the U phase of the motor fail, in the fault diagnosis method of a power electric system for a vehicle according to the exemplary embodiment of the present invention, FIG. 8 is a diagram illustrating a configuration of a fault diagnosis apparatus configured for a power electric system for a vehicle according to an exemplary embodiment of the present invention, and FIG. 9 is a diagram illustrating that an output voltage command of an inverter is generated in the fault diagnosis apparatus of a power electric system for a vehicle according to the exemplary embodiment of the present invention.

In an exemplary embodiment of the present invention, the wire member 140 includes a cable or at least a wire but is not limited thereto.

Referring to FIG. 8, a fault diagnosis apparatus of a power electric system for a vehicle according to an exemplary embodiment of the present invention may include a power transmission unit 100, a current sensor 200, a voltage sensor 300, and a controller 400. A charger 500 shown on the right side of FIG. 8 is configured to provide power for charging a vehicle battery. According to an exemplary embodiment of the present invention, the charger 500 may be electric vehicle supply equipment (EVSE) of a charging station that provides power for charging the vehicle battery.

The power transmission unit 100 is configured to receive power supplied from the charger 500 and charges a battery 110. As illustrated in FIG. 8, the power transmission unit 100 may include the battery 110, a motor 120, an inverter 130 connected in parallel to the battery 110 and connected to the motor 120 and including a plurality of switching elements S1 to S6, and a relay 150 connected to a neutral stage of the motor 120. Here, the motor 120 may be a three-phase motor having three phases u, v, and w according to an exemplary embodiment of the present invention. The inverter 130 may output a three-phase signal to the motor 120 through the plurality of switching elements S1-S6 connected to each other in the inverter 130. At the instant time, the three-phase signal may include an output voltage and an output current that are input to each phase of the motor 120.

Furthermore, as illustrated in FIG. 8, the power transmission unit 100 may further include a neutral stage capacitor Cch connected in parallel to a neutral stage (node 's') of the motor 120, relays R1 and R2 connected to the inverter 130.

The current sensor 200 is configured to measure a current input to each phase u, v, and w of the motor 120. Furthermore, the voltage sensor 300 is configured to measure a voltage Vch of the neutral stage 's' of the motor 120.

The controller 400 may drive the inverter 130 according to a separate voltage command for the fault detection and detect faults of the wire member 140 connecting between the inverter 130 and the motor 120 and the relay 150 connected to the neutral stage of the motor based on a current value input to each phase of the motor 120 measured by the current sensor 200 and a voltage value of the neutral stage of the motor measured by the voltage sensor 300. According to various aspects of the present invention, the controller 400 may be a microcomputer or the like.

The controller 400 may include a current controller 410, a voltage controller 420, and a final output voltage command generation unit 430.

Referring to FIG. 9, the current controller 410 may receive the preset current command for diagnosing the fault of the wire member 140 connecting between the inverter 130 and the motor 120 and the current value input to each phase of the motor 120 measured by the current sensor 200, and generate the voltage command of each phase of the motor 120. Here, the preset current command for the fault diagnosis of the wire member 140 connecting between the inverter 130 and the motor 120 may be generated by a microcomputer or the like according to the exemplary embodiment as a current preset by the controller 400 for diagnosing the fault of the wire member 140. Furthermore, the current command for the fault diagnosis of the wire member 140 may include a d-axis current command and a q-axis current command. Although not shown in detail in FIG. 9, the current controller 410 may receive the d-axis current command and the q-axis current command and the current value input to each phase of the motor 120 measured by the current sensor 200, generate the d-axis voltage command and the q-axis voltage command and perform a phase conversion of the d-axis voltage command and the q-axis voltage command to generate voltage commands VuN*, VvN*, and VwN* of each phase u, v, and w of the motor as illustrated in FIG. 9.

Furthermore, the voltage commands VuN*, VvN*, and VwN* of each phase of the motor generated by the current controller 410 may be a differential mode (DM) voltage component. Here, the differential mode voltage component is a component generated due to a difference in each phase u, v, and w of the motor 120, and is a component affecting the current of each phase u, v, and w of the motor.

The voltage controller 420 is configured to receive the preset voltage command for the fault diagnosis of the relay connected to the neutral stage of the motor 120 and the voltage value of the neutral stage of the motor 120 measured by the voltage sensor 300 and generate the voltage command of the neutral stage of the motor 120. Here, the preset voltage command for the fault diagnosis of the relay connected to the neutral stage of the motor 120 may be generated in the microcomputer or the like according to the exemplary embodiment as the current preset by the controller 400 for diagnosing the fault of the relay 150.

Furthermore, the voltage command VsN* of the neutral stage of the motor generated by the voltage controller 420 may be the common mode (CM) voltage component. Here, the common mode voltage component is a component which is commonly generated in each phase u, v, and w of the motor 120, and is a component which affects a voltage Vch of the neutral stage of the motor and the current of the neutral stage.

As illustrated in FIG. 9, the final output voltage command generation unit 430 may generate the final output voltage command VuN*, VvN*, and VwN* of the inverter by adding the voltage commands VuN*, VvN*, and VwN* of each phase which are generated by the current controller 410 and the voltage command VsN* of the neural stage of the motor 120 which is generated by the voltage controller 420. At the instant time, the final output voltage commands VuN*, VvN*, and VwN* of the inverter generated by the final output voltage command generation unit 430 may include the differential mode voltage component and the common mode voltage component.

The controller 400 may drive the inverter 130 by controlling a duty of the plurality of switching elements S1 to S6 included in the inverter 130 based on the final output voltage commands VuN*, VvN*, and VwN* generated according to the above-described method and detect the faults of the wire member 140 connecting between the inverter 130 and the motor 120 and the relay 150 connected to the neutral stage of the motor based on the current values input to each phase of the motor 120 measured by the current sensor 200 and the voltage values of the neutral stage of the motor measured by the voltage sensor 300.

When the value of the current input to each phase of the motor 120 measured by the current sensor 200 is periodically changed in a form of a sinusoidal wave as illustrated in FIG. 4, the controller 400 may determine that the wire member 140 connected to each phase of the motor 120 is normal.

On the other hand, when there is zero in the current values input to each phase of the motor 120 measured by the current sensor 200, the controller 400 may determine that the wire member 140 connected to the phase on which the zero is measured fails. Referring to FIG. 5, when the wire member 140 connected to the U-phase of the motor 120 fails, the current value input to the U phase may be measured to be 0, and the controller 400 may determine that the wire member 140 connected to the U phase fails.

Furthermore, if the voltage of the neutral stage of the motor measured by the voltage sensor 300 is zero while the relay 150 is open, the controller 400 may determine that the relay 150 is normal as illustrated in FIG. 4.

On the other hand, if the voltage of the neutral stage of the motor measured by the voltage sensor 300 is in the preset error range of the voltage command of the neutral stage of the motor while the relay 150 is open, the controller 400 may determine that the relay 150 is fused. For example, when the voltage command of the neutral stage of the motor is 400V, if the voltage of the neutral stage of the motor measured by the voltage sensor 300 while the relay 150 is open is in the preset error range based on 400V, for example, if the voltage of the neutral stage of the motor is in the range of 398V to 402V, the controller 400 may determine that the relay 150 connected to the neutral stage is fused.

Meanwhile, referring to FIG. 5, according to the apparatus configured for diagnosing a fault of a power electric system for a vehicle according to the exemplary embodiment of the present invention, even if the wire member 140 connected to the U phase of the motor fails and no current flows into the U phase, there is no influence on the voltage of the neural stage of the motor. Furthermore, referring to FIG. 6, even if the relay connected to the neural stage of the motor is fused, the shape and size of the current input to each phase of the motor are not affected.

Furthermore, referring to FIG. 7, if the current input to the U phase measured by the current sensor 200 is zero and the voltage of the neutral stage of the motor measured by the voltage sensor 300 is measured by the voltage command value of the neutral stage of the motor, the controller 400 may simultaneously diagnose that the wire member 140 connected to the motor and the relay connected to the neutral stage of the motor are in the fault state.

According to an exemplary embodiment of the present invention, the faults of the wire member 140 connected to each phase of the motor and the relay connected to the neutral stage of the motor may be simultaneously diagnosed even when the motor is not rotated, that is, when there is no vehicle speed, improving the safety of the vehicle.

Furthermore, even if the fault diagnoses of the wire member 140 connected to each phase of the motor and the relay connected to the neutral stage of the motor are performed at the same time, it is possible to prevent the wrong diagnosis by distinguishing between the faults of the wire member 140 and the relay without the mutual interference of these faults.

Furthermore, it is possible to shorten the driving or charging time by reducing the failure diagnosis time and improving the commerciality accordingly.

Meanwhile, as illustrated in FIG. 2, the fault diagnosis method of a power electric system for a vehicle according to an exemplary embodiment of the present invention based on the fault diagnosis apparatus of a power electric system for a vehicle as described above includes driving an inverter to output an output voltage command for the fault detection (S100), measuring a current input to each phase of a motor connected to an inverter (S200), measuring a voltage of the neutral stage of the motor (S300), and determining whether there are faults of a wire member 140 connecting between the inverter and the motor and a relay connected to the neutral stage of the motor based on the measured current input to each phase of the motor and the voltage of the neutral stage (S400).

The method may further include generating an output voltage command for the fault detection prior to driving the inverter to output the output voltage command for the fault detection.

As illustrated in FIG. 3, the generating of the output voltage command for the fault detection may include receiving the current command for the fault diagnosis of the wire member 140 connected to the inverter and the motor which is preset by a current controller and current measurement values input to each phase of the motor and generating a voltage command of each phase of the motor (S10), receiving the voltage command for the fault diagnosis of the relay connected to the neutral stage of the motor which is preset by the voltage controller and a voltage measurement value of the neutral stage of the motor and generating a neutral stage voltage command of the motor (S20), and generating a final output voltage command of the inverter by adding the voltage command of each phase generated by the current controller to the voltage command value of the neutral stage of the motor generated by the voltage controller (S30).

In the determining whether there are the faults of the wire member 140 connecting between the inverter and the motor and the relay connected to the neutral stage of the motor, if the value of the measured current input to each phase of the motor is periodically changed in a form of a sinusoidal wave, it may be determined that the wire member 140 is normal. On the other hand, if the measured current input to each phase of the motor is not zero, rather than the sinusoidal wave, it may be determined that the wire member 140 connected to a phase on which the zero is measured fails.

Furthermore, in the determining whether there are the faults of the wire member 140 connecting between the inverter and the motor and the relay connected to the neutral stage of the motor, if the voltage of the neutral stage of the motor measured while the relay is open is not changed before and after the voltage command for the fault diagnosis of the relay is generated, it may be determined that the corresponding relay is normal. On the other hand, if the voltage of the neutral stage of the motor measured while the relay is open is within the preset error range of the voltage command of the neutral stage of the motor, it may be determined that the corresponding relay is fused.

For convenience in explanation and accurate definition in the appended claims, the terms "upper", "lower", "inner", "outer", "up", "down", "upper", "lower", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A fault diagnosis method of a power electric system for a vehicle, the fault diagnosis method comprising:
    driving, by a controller, an inverter of the power electric system to output an output voltage command for fault detection;
    measuring, by the controller, a current input to each phase of a motor of the power electric system, the motor electrically connected to the inverter;
    measuring by the controller, a voltage of a neutral stage of the motor; and
    determining, by the controller, when there are faults of a connection member connecting between the inverter and the motor and a relay connected to the neutral stage of the motor based on the measured current input to each phase of the motor and the voltage of the neutral stage.

2. The method of claim 1, further including:
    prior to driving the inverter to output the output voltage command for the fault detection,
    generating, by the controller, the output voltage command for the fault detection.

3. The method of claim 2, wherein the generating of the output voltage command for the fault detection includes:
    receiving a current command for fault diagnosis of the connection member connected to the inverter and the motor which is preset by a current controller of the controller and a current measurement value input to each phase of the motor and generating a voltage command of each phase of the motor;
    receiving the voltage command for the fault diagnosis of the relay connected to the neutral stage of the motor which is preset by a voltage controller of the controller and a voltage measurement value of the neutral stage of the motor, and generating a neutral stage voltage command of the motor; and
    generating a final output voltage command of the inverter by adding the voltage command of each phase generated by the current controller to a voltage command value of the neutral stage of the motor generated by the voltage controller.

4. The method of claim 1, wherein in the determining of when there are the faults of the connection member connecting between the inverter and the motor and the relay connected to the neutral stage of the motor,
    when the measured current input to each phase of the motor is in a sinusoidal wave, it is determined, by the controller, that the connection member is normal.

5. The method of claim 4, wherein in the determining of when there are the faults of the connection member connecting between the inverter and the motor and the relay connected to the neutral stage of the motor,
    when the measured current is zero rather than the sinusoidal wave, it is determined, by the controller, that the connection member connected to a phase on which the zero is measured fails.

6. The method of claim 3, wherein in the determining of when there are the faults of the connection member connecting between the inverter and the motor and the relay connected to the neutral stage of the motor,
    when the voltage of the neutral stage of the motor measured while the relay is open is not changed before and after the voltage command for the fault diagnosis of the relay is generated, it is determined, by the controller, that the relay which is open is normal.

7. The method of claim 3, wherein in the determining of when there are the faults of the connection member connecting between the inverter and the motor and the relay connected to the neutral stage of the motor,
    when the voltage of the neutral stage of the motor measured while the relay is open is within a preset error range of the voltage command of the neutral stage of the motor, it is determined, by the controller, that the relay which is open is fused.

8. A fault diagnosis apparatus of a power electric system for a vehicle, the fault diagnosis apparatus comprising:
    a power transmission unit including a battery, a motor, an inverter connected in parallel to the battery and connected to the motor, and a relay connected to a neutral stage of the motor;
    a current sensor configured to measure a current input to each phase of the motor;
    a voltage sensor configured to measure a voltage of the neutral stage of the motor; and a controller engaged to the current sensor and the voltage sensor and configured to drive the inverter according to a separate voltage command for fault detection and detect faults of a connection member connecting between the inverter and the motor and the relay based on a current value measured by the current sensor and a voltage value measured by the voltage sensor.

9. The fault diagnosis apparatus of claim 8, wherein the controller includes:
a current controller configured to receive a preset current command for fault diagnosis of the connection member connected to the inverter and the motor and a current measurement value input to each phase of the motor and generate a voltage command of each phase of the motor;
a voltage controller configured to receive a preset voltage command for fault diagnosis of the relay connected to the neutral stage of the motor and a voltage measurement value of the neutral stage of the motor and generate a voltage command of the neutral stage of the motor; and
a final output voltage command generation unit configured to generate a final output voltage command of the inverter by adding the voltage command of each phase generated by the current controller to the voltage command of the neutral stage of the motor generated by the voltage controller.

10. The fault diagnosis apparatus of claim 8,
wherein the controller is configured to determine that the connection member is normal when a value of the measured current input to each phase of the motor is periodically changed in a sinusoidal wave.

11. The fault diagnosis apparatus of claim 8,
wherein the controller is configured to determine that the connection member connected to the phase on which the zero is measured fails when there is zero in the measured current values input to each phase of the motor.

12. The fault diagnosis apparatus of claim 8,
wherein the controller is configured to determine that the relay is normal when the voltage of the neutral stage of the motor measured while the relay is open is not changed before and after a voltage command for the fault diagnosis of the relay is generated.

13. The fault diagnosis apparatus of claim 8,
wherein the controller is configured to determine that the relay is fused when the voltage of the neutral stage of the motor measured while the relay is open is within a preset error range of the voltage command of the neutral stage of the motor.

14. The fault diagnosis apparatus of claim 9,
wherein the voltage command of each phase of the motor generated by the current controller is a differential mode (DM) voltage component, and
wherein the voltage command of the neutral stage of the motor generated by the voltage controller is a common mode (CM) voltage component.

15. The fault diagnosis apparatus of claim 14,
wherein the final output voltage command of the inverter generated by the final output voltage command generation unit includes the differential mode voltage component and the common mode voltage component.

* * * * *